(12) United States Patent
Wiki et al.

(10) Patent No.: US 7,625,675 B2
(45) Date of Patent: Dec. 1, 2009

(54) METHOD FOR PRODUCING MASKS FOR PHOTOLITHOGRAPHY AND THE USE OF SUCH MASKS

(75) Inventors: Max Wiki, Ecublens (CH); Michael Lanker, Pfaffikon (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 745 days.

(21) Appl. No.: 11/063,271

(22) Filed: Feb. 22, 2005

(65) Prior Publication Data
US 2005/0202324 A1    Sep. 15, 2005

Related U.S. Application Data

(60) Provisional application No. 60/547,694, filed on Feb. 25, 2004.

(51) Int. Cl.
*G03F 1/00* (2006.01)
(52) U.S. Cl. .................................................... 430/5
(58) Field of Classification Search ................ 430/5
See application file for complete search history.

(56) References Cited

U.S. PATENT DOCUMENTS

| | | | |
|---|---|---|---|
| 3,676,002 A | 7/1972 | Moreau | |
| 3,928,815 A | 12/1975 | Hellwarth | |
| 3,936,301 A * | 2/1976 | Schneider | 430/5 |
| 5,517,279 A | 5/1996 | Hugle et al. | |
| 5,969,441 A | 10/1999 | Loopstra et al. | |
| 6,420,073 B1 | 7/2002 | Suleski et al. | |
| 6,812,990 B1 * | 11/2004 | Hofmann et al. | 349/156 |
| 6,958,207 B1 * | 10/2005 | Khusnatdinov et al. | 430/321 |
| 2003/0205657 A1 * | 11/2003 | Voisin | 249/187.1 |

FOREIGN PATENT DOCUMENTS

| | | |
|---|---|---|
| JP | 006266091 | 9/1994 |
| WO | 98/40791 | 9/1998 |

\* cited by examiner

*Primary Examiner*—Mark F Huff
*Assistant Examiner*—Jonathan Jelsma
(74) *Attorney, Agent, or Firm*—Pearne & Gordon LLP

(57) ABSTRACT

A mask for photolithography methods comprises opaque and transparent areas as well as a surface structure. For the contact with a substrate (10) to be exposed at least a few opaque areas are incorporated and at least a few transparent areas are arranged in a spaced fashion and are deep-etched down to a structural depth. In a further embodiment at least one transparent area is designed as a positively resting area (12). The structural depth in the deep-etched areas is greater than the thickness of the surface structure, at least greater than or equal to 1 μm.

12 Claims, 2 Drawing Sheets

METHOD FOR PRODUCING MASKS FOR PHOTOLITHOGRAPHY AND THE USE OF SUCH MASKS

TECHNICAL FIELD

The invention relates to masks for lithography processes as well as the production of such masks and their use in lithography.

STATE OF THE ART

In lithography essentially three exposure methods are common as well as two methods that operate with structured masks. The masks discussed here comprise transparent areas and opaque areas. The light that is used for exposure can be transmitted through the transparent areas to a photoresist (resist) and expose it. In the opaque areas light is either absorbed, reflected, diffracted or scattered so that no or very little light propagates to the corresponding resist areas.

(i) Projection Systems

FIG. 1 shows a first method pursuant to the prior art. In order to expose the resist 4 sensitive to electromagnetic radiation on the substrate 5, the structures 2 of the mask 1 are depicted by means of a projection system 3 (e.g. a lens system, mirror system or microlenses). Typical depiction ratios of the original image on the mask to the image on the resist are 1:1 or less, such as e.g. 1:4 or 1:5.

In the case of small depiction ratios and large substrates often additionally the stepper technique is used, in which the image of the mask is exposed successively in several locations on the substrate.

The mask is not in contact with the substrate to be exposed in this method.

Lithography systems of this kind are described in U.S. Pat. No. 5,969,441 and WO98/40791. One example for the depiction using microlens arrays can be found in U.S. Pat. No. 5,517,279.

(ii) Contact Printing

Contact printing is an exposure method illustrated by way of example in FIG. 2 that foregoes the projection system. In order to achieve still good resolution of smaller structures 2, the mask 1 is brought into contact with the substrate 5 (with the resist 4 located thereon). This can be accomplished with the help of applying pressure on the mask or by means of a device for suctioning off the air between the mask 1 and the substrate 5. During the exposure the mask 1 is in contact with the substrate 5.

(iii) Proximity Printing

In the case of proximity printing, as illustrated in FIG. 3, the projection system is foregone as well. However in order to prevent contamination of the mask 1, the mask 1 is attached in the vicinity of the substrate 5. The distance between the substrate 5 and the mask 1 can range between several micrometers to about one millimeter. The radiation-sensitive resist is again marked with 5, the structures to be depicted with 2.

Analog to contact printing the mask is exposed with the electromagnetic radiation, which shines in preferably vertically onto the substrate and is collimated.

This method has a clear advantage compared to the contact method for applications in which areas on the resist that are exposed to the electromagnetic radiation should contain no defects, i.e. no unexposed areas ('Resist Plus Defects').

Defects on the mask are depicted fuzzy due to deflection so that they are no longer recognizable in the exposed resist.

U.S. Pat. No. 3,676,002 describes lithography masks, which are held substantially at a distance to the substrate by photoresist structures. Said photoresist structures can furthermore also be used to guide light directly onto the surface of the substrate. The blackened parts of the mask do not come in contact with the substrate. Additionally U.S. Pat. No. 6,420,073 describes the manufacture of lithography masks, in which etching steps are used for structuring purposes. Here the thickness of a light-absorbing material is varied locally, and hence the amount of light absorption. The resulting mask surface is no longer flat. The thickness variation is less than one micrometer. The masks can be used for contact lithography, wherein the mask surface is not pressed evenly on the substrate. The Japanese publication JP006266091 describes the production of a structured lithography mask. The mask is structured in order to obtain specific areas that shift the phase of the incident light by 180°. U.S. Pat. No. 3,928,815, in turn describes a mask system utilizing the near field of a light structure. The light energy is formed by a suitable absorbing structured layer. The resulting light structure is held in the area of the near field of the light to the substrate by a control mechanism.

DISADVANTAGES OF THE STATE OF THE ART

Lithography systems comprising projection systems are very expensive. These systems use in particular ultraviolet radiation (UV) and extreme UV (EUV) light sources, which makes the lenses even more expensive. Also the use of the stepper technique is very complex for the exposure of large substrates. A process that is able to expose the entire substrate parallel and without a projection system is beneficial.

Contact printing, as described above, has the advantage that the structures to be depicted are transmitted into the photoresist with very good resolution (up to dimensions of the wavelength of the electromagnetic radiation). Upon contact of the mask with the substrate, however, the mask becomes contaminated and must be subjected again to a complex cleaning operation after one or more exposures. Due to the repeated pressing the lithography mask becomes worn so that it has only a limited service life. A lithography mask typically has to be replaced after 1000 prints and must be checked after several prints.

Said contamination can also lead to errors in lithography, such as holes in the unexposed photoresist (pinholes) or a non-stripped photoresist (Resist-Plus Defects) where it was exposed. Another negative effect of contact lithography is caused by the air cushion, which always remains between the substrate and the lithography mask. Said air cushion has a thickness at which interference effects can become noticeable in a disruptive manner.

Methods in which the contact can be foregone are therefore beneficial.

The proximity exposure method (iii) takes this fact into consideration. Due to the distance to the mask, however, the shapes of the structures are slightly modified as a cause of the fuzzy depiction. The reasons for this are diffraction effects of the electromagnetic radiation on the transitions from the transparent to the opaque areas.

Due to prior correction of the shapes (structures) on the mask, the shapes can be corrected beforehand. In technical terminology this process is referred to as 'Optical Pattern [sic] Correction' (OPC), as described in U.S. Pat. No. 6,194,104 B1. The disadvantage here is that during the design and exposure of the OPC masks attention must be paid that the distance between the mask and the substrate is exactly known and that it must be adhered to during exposure since the OPC corrections are dependent upon said distance. Moreover, the OPC cannot randomly correct the diffraction effects. In particular structures in which the corners have to be depicted can be corrected only to a limited extent.

U.S. Pat. No. 3,676,002 describes a method in which the mask is held at a defined distance to the substrate by elevations in the transparent area. The elevations simultaneously serve as light pipes, which improves an exact depiction of the structures. This means that only areas that allow light to penetrate come in contact with the substrate. These areas consist of photoresist.

The disadvantage is that the mask in the transparent area is in contact with the substrate and therefore frequently 'Resist Plus Defects' develop as in the case of the contact method. Moreover the afore-mentioned photoresist structures are mechanically and chemically very unstable and have to be replaced after a few prints.

The production and use of structured lithography masks are also described in U.S. Pat. No. 5,928,815, in U.S. Pat. No. 6,420,073 (see above) and in JP6266091 (see above.). U.S. Pat. No. 5,928,815 shows a mask system, which takes advantage of the near range of a light structure for exposure purposes. In order to guarantee an exact distance between the mask and substrate, said distance is maintained actively constant using an apparatus. Said distance should be in the area of the near field of the light structure that is supposed to be transmitted to the photoresist of the substrate. The desired distance between the substrate and mask system is several 100 nm.

In JP6266091 the depth modulation must be designed such that the phase of the light is rotated 180 degrees. This is only possible with the above-mentioned small etching depth. For masks as we describe them this effect is not required.

In U.S. Pat. No. 6,420,073 the depth modulation leads to a modulation of the absorption of the exposure radiation. In order to obtain good resolution, a material must be used that has a high absorption rate and hence enables thin absorbing layers. A realistic thickness of the absorbing layer and hence the maximum depth modulation is below one micrometer.

OVERVIEW OF THE PRESENT INVENTION

Figure 1:
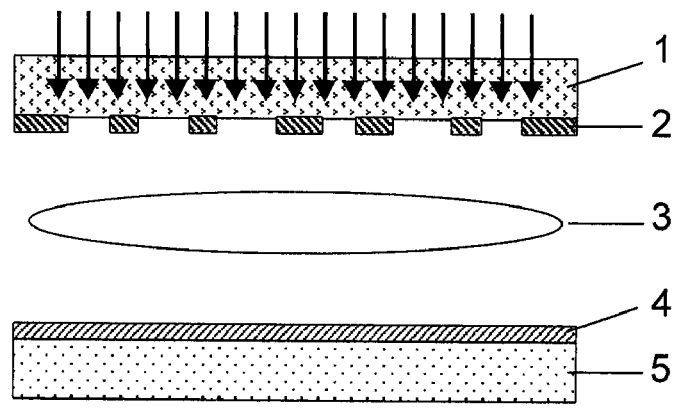
FIGS. 1-3 show photolithography methods pursuant to the prior art
Figure 2:
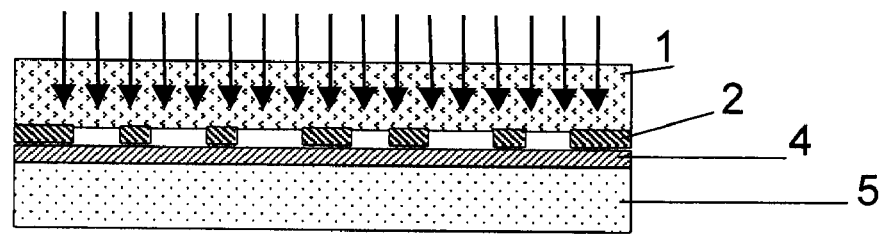
Figure 3:
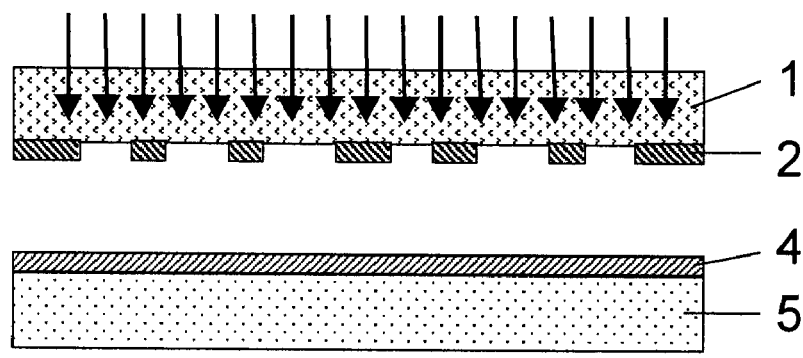

It is the technical object of the invention to provide a method, which allows small structures to be transmitted from a mask in the photoresist using electromagnetic radiation without defects and with good resolution in a cost-effective way.

This is achieved using a mask in which dark or non-critical areas come in contact with the substrate. For light areas, which are supposed to be exposed all the way, we avoid contact of the mask with the substrate. It is the object of our invention to increase the mask usage duration significantly.

The state of the art describes masks with structuring having a comparatively low depth (typically: several 100 nm). In the present invention by contrast structuring in the range of several micrometers is used, preferably 5 μm. This large distance however is necessary to achieve effective protection from contamination as well as to eliminate disruptive interference effects from the air cushion.

The contamination of the mask and the substrate brought along by the inventive method shall be so minimal that the number of transmissions achieved with a mask is higher compared to the prior art.

DETAILED DESCRIPTION OF THE INVENTION

To achieve the object a mask that comprises both opaque and transparent areas is used. Moreover the surface of the mask pursuant to the invention contains such a surface structure that when the mask rests on a substrate that is supposed to be exposed at least a few opaque areas positively rest on it (contact areas), while at least a few transparent areas are spaced in relation to the substrate (spaced areas). This way it is achieved that during the exposure step the opaque contact areas enable very good resolution and simultaneously due to the spacing of the transparent areas the mask in these spaced transparent areas is not contaminated by the substrate.

Preferably, wherever possible, the contact between the mask and substrate is avoided in the transparent areas. For this purpose, the mask is deep-etched partially in the transparent areas, typically 5 μm deep. This way the etched areas do not come in contact with the substrate during lithography, and also dirt particles on the substrate that are smaller than the etching depth have no contact with the mask.

This avoids the "Resist-Plus" defects in the substrate due to less contamination of the mask, increases intervals between two cleaning operations of the mask and increases its service life.

Additionally the structured mask should be mechanically robust. If the contact areas compared to the structural depth are too narrow (too small web width), there is a risk that they easily break off for example during the exposure process. Therefore it is preferably attempted to adhere to a "web width to structural depth" ratio, which in essence does not amount to less than 1:2, and preferably is 1:1 or above.

In areas in which a very high resolution is required (for example in the order of magnitude of the wavelength used for exposure) this can mean that only a very small structural depth is permitted. Moreover it is difficult for small structures to realize large structural depths. With respect to the robustness of the mask and its manufacturability, it may therefore be beneficial to implement transparent areas as contact or near-contact areas.

A mask pursuant to the invention therefore comprises both opaque contact areas and transparent spaced areas, but it can also comprise transparent contact areas. Typically however one will attempt to incorporate as many transparent areas as spaced areas as possible.

Masks pursuant to the invention that also comprise opaque spaced areas are feasible and certainly considered within the framework of the present invention. The edge then, however, is spaced from the substrate that is supposed to be exposed, which directly influences the resolution.

In its use (exposure), the mask must be able to be placed evenly, stable and reproducibly on a substrate that is to be exposed. In doing so the distribution of the contact areas across the mask surface plays a role. They should be distributed across the entire mask surface. In order to ensure even contact of the mask on the substrate, the mask is pressed on the substrate using a certain amount of force. When the surface ratio of contact areas to spaced areas is too small, the pressure that is exercised by the contact areas on the substrate is too great, and the mask and/or substrate run the risk of becoming damaged. A suitable surface ratio of the contact to the spaced surface would be about 1:100, preferably however 1:10 or larger. The above-mentioned surface ratio should be guaranteed within smaller partial surfaces of several square centimeters.

In summary, a mask pursuant to the invention for photolithography methods comprises opaque and transparent areas as well as a surface structure. For the contact with a substrate (10) that is to be exposed, at least a few opaque areas are designed as positively resting areas and at least a few transparent areas are spaced and deep-etched down to a structural depth. In a further embodiment at least one transparent area is designed as a positively resting area (12). In another embodiment the positively resting areas are essentially identical to areas that are provided for the exposure of high-resolution structures. The structural depth in the deep-etched areas is greater than the thickness of the surface structure, at any rate however greater than or equal to 1 μm, and preferably 5 μm.

Example/Preferred Embodiment

A lithography method comprising a mask pursuant to the invention can contain for example the following steps.

Provision of a substrate that is to be structured with a photo-sensitive layer

Application of a mask on the substrate in such a way that opaque contact areas and transparent spaced areas are accomplished Exposure of the substrate through the mask Development of the photo-sensitive layer.

Of course subsequently etching techniques can be applied. Additionally the mask pursuant to the invention can also be used within the framework of a lift-off procedure.

In order to produce a mask pursuant to the invention, a commercially available lithography mask can be partially etched. Such a commercially available mask can be procured for example from Photronics Inc., Dresden, Germany. The transparent base material is typically quartz glass. On the mask the opaque areas are implemented by being covered with chrome. The shapes of the Cr structures are written for example by means of an e-beam or laser writer.

Figure 4:
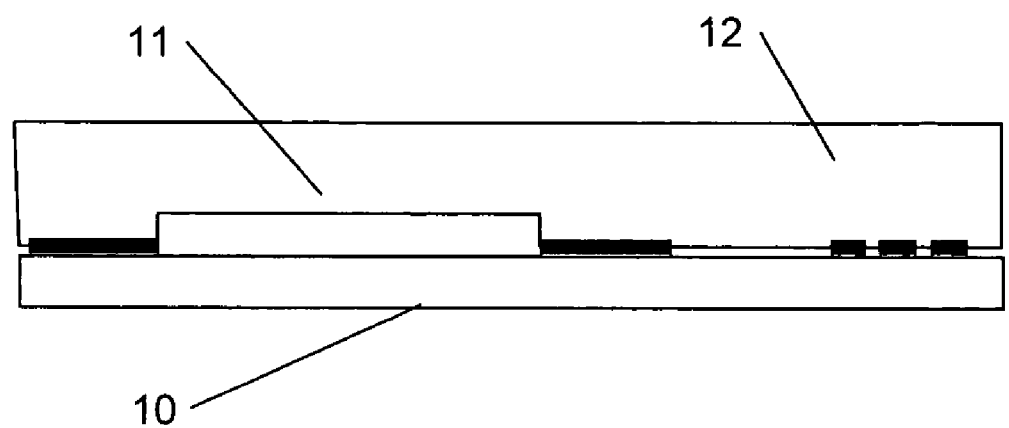
FIG. 4 shows an embodiment of the mask for photolithography pursuant to the invention

The mask (reference to FIG. 4) is partially structured with the aid of photolithography techniques and subsequently etched. The areas 12, which require a good resolution, are not etched; the areas 11, which are exposed and carry no structures, are deep-etched across a large surface. The structural depth in the deep-etched areas is hence greater than the thickness of the surface structure, the layer thickness of which as mentioned above is in the range of 100 nm. Feature 10 is the substrate, which is exposed.

The partial structuring of the mask pursuant to the invention can be realized with the following process steps:

Treatment of the mask that is to be structured with a bonding agent, such as hexamethyldisilazane vapors (HMDS)

Application of photoresist on the mask, such as AZ1518 by Clariant. The application occurs typically by means of spin-on deposition.

Masking of the areas that are not supposed to be deep-etched and exposure of the photoresist, typically with UV light, e.g. with a wavelength of 365 nm. Masking of the areas can be achieved for example by another mask. Exposure can occur by means of contact lithography, proximity or another lithography method.

Development of the exposed photoresist. A commercially available developer is MP303 by Shipley. The developer strips the exposed photoresist and leaves the unexposed one largely unchanged.

Etching of the exposed areas. The photoresist here acts such that is masks the areas that are not supposed to be etched. Possible etching techniques include reactive ion etching (RIE) or similar dry etching methods as well as wet etching methods.

Cleaning of the photomask. In doing so, residue of the photoresist as well as etching products are removed. Available cleaning agents include solvents, acids, oxygen plasma and others.

The photoresist protects the chrome layer from etching. Many lithomasks are equipped with an absorbent layer made of chromium oxide, which can be attacked during the etching process.

If the partial removal of said absorbent layer is acceptable, the chrome layer itself can be used as the etching mask. A photoresist step is then foregone. The mask is etched directly using a suitable method.

A suitable method is the plasma-supported etching process using fluor-chloro hydrocarbons and argon. Said method etches the material of the lithography masks, quartz glass, very well compared to the removal of chrome.

This simplified mask structuring process, however, causes the supporting webs to be distributed in a stable and sufficiently even fashion across the mask. This requirement, if need be, can be fulfilled when designing the mask, such as through structures that fulfill only this support function.

Wet etching methods, such as hydrofluoric acid-based etching agents, are much more selective and avoid the above-mentioned attack on the absorbing layer.

The chrome layer of the lithography mask is also used as an etching block in so-called self-aligned lithography methods. In doing so the lithography that is supposed to structure the mask is placed on the mask structures such that the edges of the mask structures define the shape of the etched areas. The edge of the mask structure and the edge of the photoresist are typically separated by several micrometers. The advantage of this method is in the reduced requirement for accuracy with which the photoresist must be structured.

Photoresist can be applied selectively via the chrome structures of the mask. For this purpose the mask is covered with photoresist. Said photoresist is exposed from the back, wherein the mask structure itself shields the photoresist. Upon development the chrome-plated structures are exactly covered with photoresist. Said structures are hence protected during the further etching process.

Further lithography improvements are feasible. For example the photoresist layer can be used to structure an additional layer. Said additional layer is previously applied to the mask and after its structuring serves as an etching mask. Suitable materials for such a masking layer are for example nickel or silicon.

The invention claimed is:

1. Mask for photolithography method comprising opaque and transparent areas and a surface structure, characterized in that for the purpose of establishing a contact to a substrate (10) that is supposed to be exposed, at least a few opaque areas are designed as areas resting positively on said substrate and at least a few transparent areas within a portion of the mask facing entirely to said substrate are arranged spaced and deep-etched down to a structural depth, and at least one transparent area is designed as a positively resting area for resting on said substrate, wherein the structural depth in the deep-etched areas is greater than the thickness of the surface structure.

2. Mask pursuant to claim 1, characterized in that the positively resting areas are essentially identical to those areas that are provided for the exposure of high resolution structures.

3. Mask pursuant to claim 1, characterized in that the structural depth in the deep-etched areas is at least greater than or equal to 1 μm.

4. Mask pursuant to claim 1, characterized in that the ratio of the width of the contact areas to the structural depth in any case is better than 1:2.

5. Mask pursuant to claim 1, characterized in that the surface ratio of contact areas to spaced areas is at least 1:100.

6. Mask pursuant to claim 1, consisting of glass with structuring made of chrome.

7. Method for producing a mask pursuant to claim 1 comprising the following steps:
   Treatment of the mask to be structured with a bonding agent;
   Application of photoresist on the mask;
   Masking of the areas that are not supposed to be deep-etched;
   Exposure of the photoresist;
   Development of the exposed photoresists;
   Etching of the areas not covered by the photoresist;
   Cleaning of the photomask.

8. A lithography method comprising a mask pursuant to claim 1 with the following steps:
   Provision of a substrate (10) that is to be structured with a photo-sensitive layer;
   Application of a mask on the substrate such that opaque contact areas and transparent spaced areas are implemented;
   Exposure of the substrate through the mask;
   Development of the photosensitive layer.

9. The mask pursuant to claim 1, characterized in that the structural depth in the deep-etched areas is 5 μm.

10. The mask pursuant to claim 1, characterized in that the ratio of the width of the contact area to the structural depth in any case is 1:1 or above.

11. The mask pursuant to claim 1, characterized in that the surface ratio of contact areas to spaced areas is 1:10 or above.

12. The mask pursuant to claim 6, wherein the glass is quartz glass.

* * * * *

UNITED STATES PATENT AND TRADEMARK OFFICE
CERTIFICATE OF CORRECTION

| | | |
|---|---|---|
| PATENT NO. | : 7,625,675 B2 | Page 1 of 1 |
| APPLICATION NO. | : 11/063271 | |
| DATED | : December 1, 2009 | |
| INVENTOR(S) | : Max Wiki et al. | |

It is certified that error appears in the above-identified patent and that said Letters Patent is hereby corrected as shown below:

In the Specification, column 2, line 67, please insert the word -- to ensure -- after the word "paid" and before the word "that."

Signed and Sealed this

Twentieth Day of April, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,625,675 B2 |
| APPLICATION NO. | : 11/063271 |
| DATED | : December 1, 2009 |
| INVENTOR(S) | : Wiki et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1093 days.

Signed and Sealed this

Second Day of November, 2010

David J. Kappos
*Director of the United States Patent and Trademark Office*